(12) United States Patent
Govia et al.

(10) Patent No.: US 10,817,797 B1
(45) Date of Patent: Oct. 27, 2020

(54) PAIRWISE ANSATZ FOR QUANTUM PROCESS TOMOGRAPHY

(71) Applicant: RAYTHEON BBN TECHNOLOGIES CORP., Cambridge, MA (US)

(72) Inventors: Luke Colin Gene Govia, Cambridge, MA (US); Hari Kiran Krovi, Lexington, MA (US)

(73) Assignee: Raytheon BBN Technologies Corp, Cambridge, MA (US)

( * ) Notice: Subject to any disclaimer, the term of this patent is extended or adjusted under 35 U.S.C. 154(b) by 0 days.

(21) Appl. No.: 16/679,126

(22) Filed: Nov. 8, 2019

(51) Int. Cl.
*G06N 10/00* (2019.01)
*G06F 9/38* (2018.01)
*H03K 19/195* (2006.01)

(52) U.S. Cl.
CPC .......... *G06N 10/00* (2019.01); *G06F 9/3877* (2013.01); *H03K 19/195* (2013.01); *G06F 2009/3883* (2013.01)

(58) Field of Classification Search
None
See application file for complete search history.

(56) References Cited

U.S. PATENT DOCUMENTS

| | | | | |
|---|---|---|---|---|
| 9,838,141 | B2 * | 12/2017 | Martin | ................. H04L 9/0852 |
| 9,979,400 | B1 * | 5/2018 | Sete | ...................... G06N 10/00 |
| 10,332,024 | B2 * | 6/2019 | Scheer | ................. G01R 33/035 |

OTHER PUBLICATIONS

Govia, L. C. G. et al., "Bootstraping quantum process tomography via a perturbative ansatz", Feb. 27, 2019, pp. 1-10, Version 1, Cornell University.
Govia, L. C. G. et al., "Bootstraping quantum process tomography via a perturbative ansatz", May 24, 2019, pp. 1-13, Version 2, Cornell University.
Holzapfel, M. et al., "Scalable reconstruction of unitary processes and Hamiltonians", Physical Review A, 2015, pp. 042129-1-042129-10, vol. 91, American Physical Society.
Nielsen, Michael A. et al., "Quantum Noise and Quantum Operations", Chapter 8, Quantum Computation and Quantum Information, 2000, 48 pages, Cambridge University Press.

* cited by examiner

*Primary Examiner* — Jeffery S Zweizig
(74) *Attorney, Agent, or Firm* — Lewis Roca Rothgerber Christie LLP

(57) ABSTRACT

A method for characterizing an N-qubit process, for N an integer greater than 1. In some embodiments, the method includes performing a plurality of characterization measurements of the N-qubit process to form a plurality of process maps, and fitting the plurality of process maps with a composition of K-qubit processes, K being an integer greater than 1 and less than N.

20 Claims, 3 Drawing Sheets

U.S. 10,817,797 B1

PAIRWISE ANSATZ FOR QUANTUM PROCESS TOMOGRAPHY

GOVERNMENT LICENSE RIGHTS

This invention was made with U.S. Government support under contract No. W911NF-14-C-0048 awarded by the U.S. Army Research Office. The U.S. Government has certain rights in this invention.

FIELD

One or more aspects of embodiments according to the present invention relate to quantum computing, and more particularly to quantum tomography.

BACKGROUND

In the development and testing of quantum computing systems, it may be useful in various circumstances to perform quantum tomography, i.e., to estimate the effect of a quantum process on a plurality of qubits.

This is the natural domain of quantum state tomography (QST) and quantum process tomography (QPT). Respectively, QST and quantum process tomography seek to characterize the state of a quantum processor or the dynamical map of its evolution. Naïve implementations of both quantum state tomography and quantum process tomography, however, require an experimental effort that scales exponentially with the number of qubits. For practical purposes, this scaling may limit full naïve quantum state tomography and quantum process tomography to small system sizes, situations in which approximate characterizations are used, or situations with large amounts of symmetry. Further compounding quantum process tomography, the most error-prone operations may be system preparation and measurement (SPAM), which can overwhelm the intrinsic error in high fidelity quantum processes and hinder their characterization. Several SPAM-insensitive metrics exist, such as randomized benchmarking and its variants, as well as gate set tomography (GST). Randomized benchmarking has the additional benefit of overcoming the exponential scaling of standard quantum process tomography, but at the cost of returning only a single number characterizing the quantum process.

As such, there is a need for an improved method for characterizing a quantum process.

SUMMARY

According to some embodiments of the present invention, there is provided a method for characterizing an N-qubit process, N being an integer greater than 2, the method including: performing a plurality of characterization measurements of the N-qubit process to form a plurality of process maps, and fitting the plurality of process maps with a composition of K-qubit processes, K being an integer greater than 1 and less than N.

In some embodiments, the performing of the plurality of characterization measurements includes performing the characterization measurements with a method that excludes state-preparation and measurement errors.

In some embodiments, the performing of the plurality of characterization measurements includes performing the characterization measurements with gate set tomography.

In some embodiments, the performing of a characterization measurement of the plurality of characterization measurements includes: preparing K qubits of interest in a first state; preparing N-K spectator qubits in a maximally mixed state; applying a circuit including one or more gates to the K qubits of interest and to the N-K spectator qubits; and measuring, after the applying of the circuit, the state of the K qubits of interest.

In some embodiments, the performing of a characterization measurement of the plurality of characterization measurements includes: preparing K qubits of interest in a first state; preparing N-K spectator qubits in a state randomly selected from a uniform distribution of the set of spectator qubit logical states; applying a circuit including one or more gates to the K qubits of interest and to the N-K spectator qubits; and measuring, after the applying of the circuit, the state of the K qubits of interest.

In some embodiments, K=2.

In some embodiments, the performing of the plurality of characterization measurements includes performing the characterization measurements with a method that excludes state-preparation and measurement errors.

In some embodiments, the performing of the plurality of characterization measurements includes performing the characterization measurements with gate set tomography.

In some embodiments, the performing of a characterization measurement of the plurality of characterization measurements includes: preparing K qubits of interest in a first state; preparing N-K spectator qubits in a maximally mixed state; applying a circuit including one or more gates to the K qubits of interest and to the N-K spectator qubits; and measuring, after the applying of the circuit, the state of the K qubits of interest.

In some embodiments, the performing of a characterization measurement of the plurality of characterization measurements includes: preparing K qubits of interest in a first state; preparing N-K spectator qubits in a state randomly selected from a uniform distribution of the set of spectator qubit logical states; applying a circuit including one or more gates to the K qubits of interest and to the N-K spectator qubits; and measuring, after the applying of the circuit, the state of the K qubits of interest.

According to some embodiments of the present invention, there is provided a system, including: an N-qubit device; and a processing circuit, connected to the N-qubit device, the processing circuit being configured to: perform a plurality of characterization measurements of an N-qubit process to form a plurality of process maps, and fit the plurality of process maps with a composition of K-qubit processes, K being an integer greater than 1 and less than N.

In some embodiments, the performing of the plurality of characterization measurements includes performing the characterization measurements with a method that excludes state-preparation and measurement errors.

In some embodiments, the performing of the plurality of characterization measurements includes performing the characterization measurements with gate set tomography.

In some embodiments, the performing of a characterization measurement of the plurality of characterization measurements includes: preparing K qubits of interest in a first state; preparing N-K spectator qubits in a maximally mixed state; applying a circuit including one or more gates to the K qubits of interest and to the N-K spectator qubits; and measuring, after the applying of the circuit, the state of the K qubits of interest.

In some embodiments, the performing of a characterization measurement of the plurality of characterization measurements includes: preparing K qubits of interest in a first state; preparing N-K spectator qubits in a state randomly selected from a uniform distribution of the set of spectator qubit logical states; applying a circuit including one or more gates to the K qubits of interest and to the N-K spectator qubits; and measuring, after the applying of the circuit, the state of the K qubits of interest.

In some embodiments, K=2.

In some embodiments, the performing of the plurality of characterization measurements includes performing the characterization measurements with a method that excludes state-preparation and measurement errors.

In some embodiments, the performing of the plurality of characterization measurements includes performing the characterization measurements with gate set tomography.

In some embodiments, the performing of a characterization measurement of the plurality of characterization measurements includes: preparing K qubits of interest in a first state; preparing N-K spectator qubits in a maximally mixed state; applying a circuit including one or more gates to the K qubits of interest and to the N-K spectator qubits; and measuring, after the applying of the circuit, the state of the K qubits of interest.

In some embodiments, the performing of a characterization measurement of the plurality of characterization measurements includes: preparing K qubits of interest in a first state; preparing N-K spectator qubits in a state randomly selected from a uniform distribution of the set of spectator qubit logical states; applying a circuit including one or more gates to the K qubits of interest and to the N-K spectator qubits; and measuring, after the applying of the circuit, the state of the K qubits of interest.

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of exemplary embodiments of a method for characterizing a quantum process provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the scope of the invention. As denoted elsewhere herein, like element numbers are intended to indicate like elements or features.

A generic N-qubit quantum process, which may be labelled as ε, has $16^N\text{-}4^N$ free parameters. In principle, these parameters may be determined using a process that may be referred to as "naïve quantum process tomography", which may involve preparing the N-qubit system in each of a basis of possible initial states, and, for each such initial state, repeatedly causing the process to operate on the N-qubit system, and performing all possible measurements of the state of the N-qubit system after the process has operated on the N-qubit system. Causing the process to operate on the N-qubit system may involve (i) applying a plurality of gates to the N-qubit system (the plurality of gates being referred to as a "circuit", so that the applying of the plurality of gates to the N-qubit system corresponds to applying the circuit to the N-qubit system), and (ii) subjecting the N-qubit system to environmental disturbances, it being difficult or impossible to shield the N-qubit system entirely from such disturbances. As such, the process may be considered to be the combination of the circuit and the environment.

Determining the exponentially scaling number of free parameters (i.e., the $16^N\text{-}4^N$ free parameters mentioned above) may be challenging, using naïve quantum process tomography. In some embodiments, the unknown process is restricted a priori by assuming an ansatz for its form, which in turn restricts the number of free parameters in the unknown process, allowing for efficient quantum process tomography.

Process tomography can be rephrased as state tomography of the Choi dual-state (via the Choi-Jamiołkowski isomorphism), which is the state formed when the unknown process acts on one half of a maximally entangled state in a Hilbert space of dimension $2^{2N}$, given by $$\rho_\varepsilon = \frac{1}{2^N} \sum_{\mu\nu} |\psi_\mu\rangle\langle\psi_\nu| \otimes \varepsilon(|\psi_\mu\rangle\langle\psi_\nu|) \quad (1)$$

where $\{|\psi_\mu\rangle\}$ is an orthonormal basis for N-qubit Hilbert space.

Figure 1A:
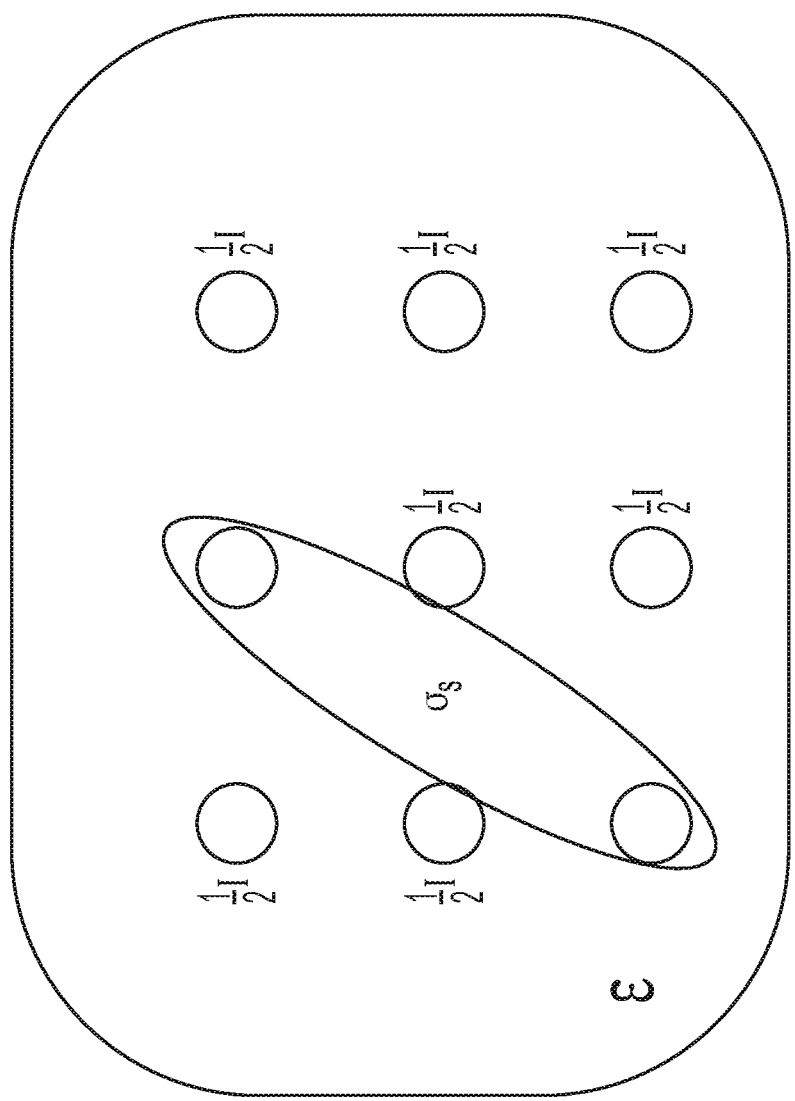
FIG. 1A is a schematic drawing of an N-qubit device, according to an embodiment of the present invention.
Figure 1B:
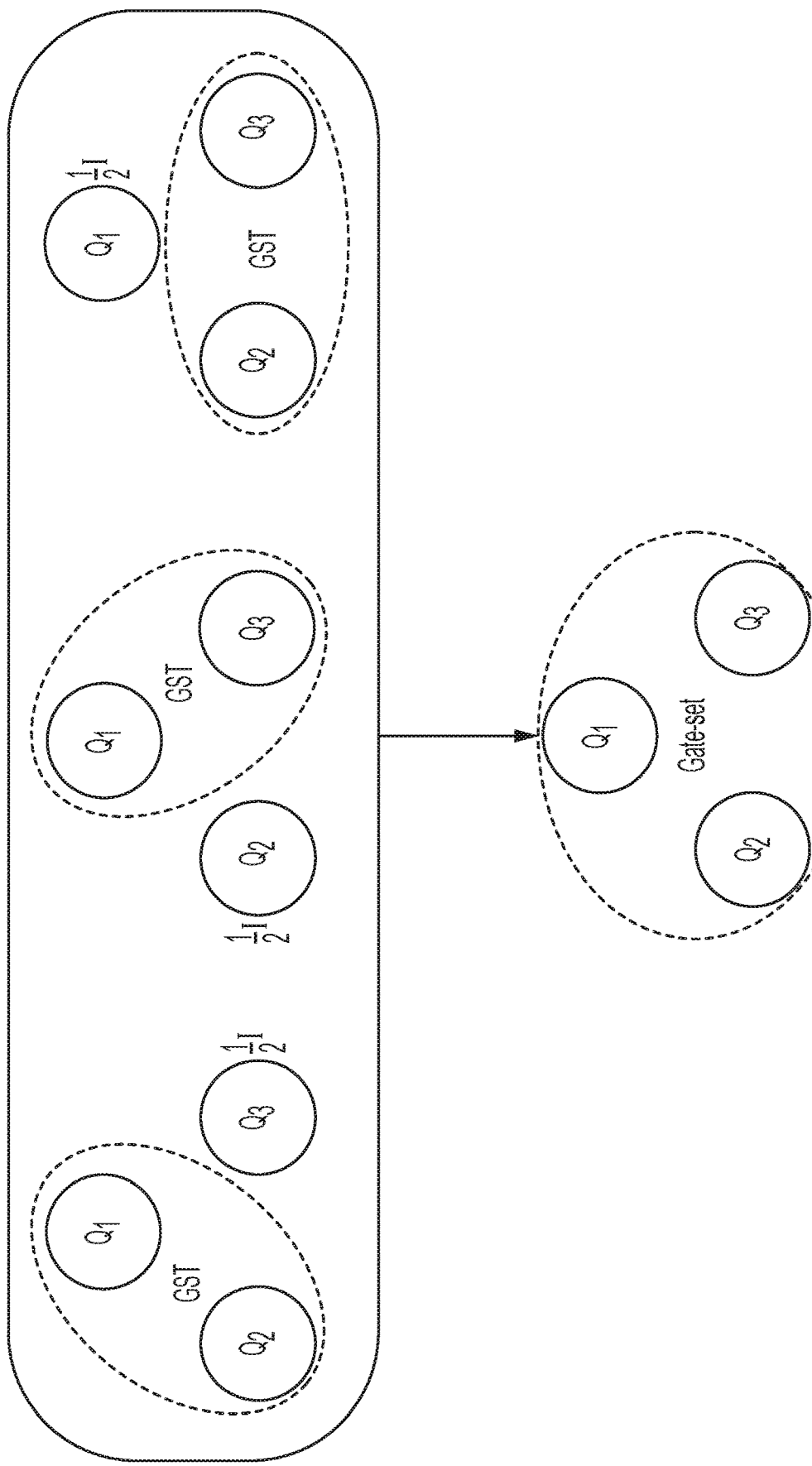
FIG. 1B is a schematic representation of a pairwise perturbative ansatz for a three-qubit device, according to an embodiment of the present invention.

In some embodiments, an ansatz, which may be referred to as a pairwise perturbative ansatz (or "PAPA"), is used, as discussed in further detail below, and as discussed in the following publication, which is incorporated herein by reference: L. C. G. Govia, G. J. Ribeill, D. Ristè, M. Ware, and H. Krovi, *Bootstrapping quantum process tomography via a perturbative ansatz*, arXiv:1902.10821v2. Referring to FIG. 1A, when a pairwise perturbative ansatz is used to perform quantum process tomography, the effective two-qubit process (Choi state $\sigma_S$) may be characterized for all qubit pairs when the unknown N-qubit process ε occurs, and all other qubits start in the maximally mixed state. FIG. 1B shows a three-qubit system. In such a system, gate set tomography may be used together with a pairwise perturbative ansatz, to bootstrap characterizations of two-qubit gate sets to a three-qubit gate set via the pairwise perturbative ansatz.

The pairwise perturbative ansatz posits that in many cases, a useful quantum process in an N-qubit system may be adequately approximated as a composition of two-qubit processes. In terms of the super-operator matrix representation $\hat{\varepsilon}$ of the quantum process E, this composition may be written $$\hat{\varepsilon} = \prod_{k=1, n=1}^{N-1, N-k} \hat{\varepsilon}_{k,n+k} \quad (2)$$

where $\hat{\varepsilon}_{k,n+k}$ is an arbitrary two-qubit process on qubits k and (n+k) with no restrictions. The product runs over all pairs of qubits, of which there are $(N^2-N)/2$. Each of the unknown two-qubit processes can be written as $$\varepsilon_{k,n+k} = \sum_{i_{k,n},j_{k,n}}^{16} \left( \chi_{i_{k,n}}^{j_{k,n}} \left( \mathcal{J}^{\otimes k-1} \otimes \mathcal{A}_{k,n}^{(k)} \otimes \mathcal{J}^{\otimes n-1} \otimes \mathcal{A}_{j_{k,n}}^{(k+n)} \otimes \mathcal{J}^{\otimes N-k-n} \right) \right) \quad (3)$$

where $\{\mathcal{A}_{k,n}^{(k)}\}$ is a complete basis for single-qubit processes and $\mathcal{J}$ is the identity process. $\chi_{i_{k,n}}^{j_{k,n}}$ is an element of the $\chi$-matrix describing the two-qubit process, and the summation variables $i_{k,n}$ and $j_{k,n}$ are subscripted to emphasize that they correspond to a particular qubit pair.

Because the pairwise perturbative ansatz of some embodiments is the composition of two-qubit processes in sequence, it captures the natural two-body quantum operations that occur in a gate-based quantum computation. It may be capable of completely specifying any ideal gate operation (e.g., any single-layer quantum circuit built from one and two-qubit gates), and may contain both single-qubit errors and correlated two-qubit errors as independent free parameters. It also describes processes that involve more than two-qubits, but as combinations of two-qubit processes performed in sequence. Thus, it describes general processes in a perturbative fashion, built from one- and two-qubit processes. While each arbitrary two-qubit process described by Equation (3) is parameterized in terms of a basis with 256 elements, its $\chi$-matrix has only 256-16=240 free parameters.

There are $$\binom{N}{2} = (N^2 - N)/2$$

two-qubit subsets, and so the total number of free parameters in the pairwise perturbative ansatz is 120 ($N^2 - N$). As this scales quadratically with qubit number, the pairwise perturbative ansatz is an efficient approach to quantum process tomography. Quantum process tomography with a pairwise perturbative ansatz includes determining the $\chi$-matrix for each two-qubit process in the product in Equation (2). In some embodiments, the tomographic characterization of two-qubit processes on all pairs of qubits is used to determine these free parameters. As such, the pairwise perturbative ansatz bootstraps from characterization of two-body processes to a multi-qubit process of pairwise perturbative ansatz form.

To compare the pairwise perturbative ansatz to two-qubit tomographic data, a notion of a two-qubit reduction of a process $\varepsilon$ may be formed. This may be done, for example, in terms of the Choi state $\rho_\varepsilon$. For the two-qubit subset $S=\{m,p\}$ this takes the form $$\rho_S = \frac{1}{2^N} \sum_{\mu\nu} Tr_{/S}[|\psi_\mu\rangle\langle\psi_\nu|] \otimes Tr_{/S}[\varepsilon(|\psi_\mu\rangle\langle\psi_\nu|)] \quad (4)$$

where $Tr_{/S}[\rho]$ means the partial trace of all qubits other than those in the set S, and the partial trace is applied to both "parts" of the Choi state. Using the orthogonality of the N-qubit basis, it follows that $$Tr_{/S}[|\psi_\mu\rangle\langle\psi_\nu|] = \delta_{\mu_{/S},\nu_{/S}}|\psi_{\mu_S}\rangle\langle\psi_{\nu_S}| \quad (5)$$

where the indices $\mu_S$ ($\mu_{/S}$) are the subset of indices in $\mu$ that correspond to the qubits inside (outside) of the subset S. Thus, the reduced Choi state of the unknown process may be written as $$\rho_S = \frac{1}{2^2} \sum_{\mu_S \nu_S} \left( |\psi_{\mu_S}\rangle\langle\psi_{\nu_S}| \otimes Tr_{/S}\left[\varepsilon\left(|\psi_{\mu_S}\rangle\langle\psi_{\nu_S}| \otimes \frac{1_{N-2}}{2^{N-2}}\right)\right] \right) \quad (6)$$

where $I_{N-2}$ is the identity matrix of dimension $2^{N-2}$.

To determine the free parameters in the pairwise perturbative ansatz, $\rho_S$, the two-qubit reduced Choi states described by Equation (6) with free parameters of the pairwise perturbative ansatz, may be compared, for each pair of qubits to the corresponding experimentally characterized two-qubit Choi state, which may be labelled $\sigma_S$. This experimentally characterized state is the result of two qubit quantum process tomography performed on the qubit pair S for the application of the global unknown process $\varepsilon$, as depicted in FIG. 1A. This may be equated to the reduced Choi state for the unknown process, $\rho_S$, to determine the free parameters in the pairwise perturbative ansatz. In other words, the equations $$\rho_S = \sigma_S \quad (7)$$

may be solved simultaneously for every pair of qubits. Operationally, this amounts to performing two-qubit quantum process tomography on the $(N^2-N)/2$ pairs of qubits. Each of the pairwise characterized two-qubit processes is described by 256-16=240 complex numbers, which gives a total of 120($N^2-N$) total complex numbers describing the two-qubit process characterization of all pairs of qubits. Thus, there are exactly as many constraints (coming from experimental characterization) as there are free parameters in pairwise perturbative ansatz, i.e., the pairwise perturbative ansatz makes use of all available data from two-qubit characterizations of the unknown multi-qubit process. Each $\rho_S$ depends on the $\chi$-matrix elements for all qubit pairs, i.e., those in all $\varepsilon_{k,n+k}$, not just the qubit pair of the subset S. Thus, each two-qubit process characterization $\sigma_S$ constrains the global process, not just the component of the ansatz on the qubits in S.

It may be seen from Equation (6) that the qubits outside the qubit pair of interest (the spectator qubits) may, in some embodiments, be prepared in the maximally mixed state. If this is experimentally challenging, spectator qubit preparations, may instead be randomly sampled from the uniform distribution of the set of spectator qubit logical states. With sufficient sampling to generate accurate statistics, the normalized sum of the randomly sampled preparation states approaches the maximally mixed state for the spectator qubits. Thus, performing two-qubit quantum process tomography on the qubit pair of interest with spectator qubits prepared in a random logical state will characterize the desired effective process in Equation (6).

In some embodiments, the pairwise perturbative ansatz is combined with gate set tomography. Gate set tomography may be performed on all qubit pairs to obtain a characterized gate set for each pair, and then the pairwise perturbative ansatz may be used to bootstrap to descriptions of an N-qubit process. The usefulness of such an approach may be understood by considering the three-qubit gate $\hat{X} \otimes \hat{Y} \otimes \hat{X}$. Given characterized gate sets with the relevant two-qubit gates, one way to describe the three-qubit process would be $$\hat{X} \otimes \hat{Y} \otimes \hat{X} \rho \hat{X} \otimes \hat{Y} \otimes \hat{X} \to G_{X_1 Y_2}(G_{Y_2 X_3}(\rho)) \quad (8)$$

where $G_{AB}$ is the experimental process when the gate $\hat{A} \otimes \hat{B}$ is applied. However, there is ambiguity in the correct decomposition of the three-qubit gate, and $Gx_1x_3 (G_{Y_2 1_3}(\rho))$ would be an equally valid description of the process. An issue arises as it is unlikely that the constructed three-qubit processes from all possible two qubit decompositions will agree with one another. Using a pairwise perturbative ansatz avoids this issue, as it finds the three qubit process of pairwise perturbative ansatz form that best agrees with the pairwise characterized processes, i.e., with $G_{X_1Y_2}$, $G_{Y_2X_3}$, and $G_{X_1X_3}$. As such, the pairwise perturbative ansatz captures context dependence between gate operations, such as when the effect on qubit 1 is different for the processes $G_{X_1Y_2}$ and $G_{X_1X_3}$. As an added benefit, it is not necessary to implement the full N-qubit process, as may be done when using a pairwise perturbative ansatz without gate set tomography (as described above). Instead, pairwise perturbative ansatz characterizations of the processes in an N-qubit gate set may be bootstrapped from the characterized gate sets on all qubit pairs, as illustrated in FIG. 1B.

In some embodiments, the ansatz is generalized from a pairwise perturbative ansatz to a K-wise perturbative ansatz, in a straightforward manner. In this generalized K-wise perturbative ansatz, a quantum process in an N-qubit system is approximated as a composition of K-qubit processes. Such a generalized ansatz (with, e.g., K=3) may be helpful, for example, when characterizing a circuit that includes one or more gates that create three-qubit entanglements, and that may therefore be poorly represented by a composition of two-qubit processes.

To summarize, in some embodiments, a K-wise perturbative ansatz may be employed to characterize an N-qubit process by performing a plurality of characterization measurements of the N-qubit process to form a plurality of (K-qubit, e.g., two-qubit) process maps, and fitting the plurality of process maps with a composition of K-qubit processes, K being an integer greater than 1 and less than N. In some embodiments, the characterization measurements are performed with gate set tomography. In some embodiments, the performing of one of the characterization measurements includes (i) preparing the K qubits of interest in a first state; (ii) preparing the N-K spectator qubits in a maximally mixed state; (iii) applying a circuit comprising one or more gates to the K qubits of interest and to the N-K spectator qubits; and (iv) measuring, after the applying of the circuit, the state of the K qubits of interest.

After fitting the plurality of process maps with a composition of K-qubit processes, the result of the fitting (the set of set of $\chi_{d_{k,n}}^{j_{k,n}}$) may be used to reconstruct the Choi matrix for the experimentally characterized process (which may be referred to as the "experimental Choi matrix"). A designer of a process for implementing a circuit for a quantum computing system may then assess the extent to which the process behaves as intended (i.e., the extent to which the process behaves as the circuit) by comparing the experimental Choi matrix to the Choi matrix for the circuit that the designer intends to implement (which may be referred to as the "ideal Choi matrix"). The differences between the experimental Choi matrix and the ideal Choi matrix (measured, for example, as a trace distance between the experimental Choi matrix and the ideal Choi matrix, or as a Frobenius norm of the difference between the experimental Choi matrix and the ideal Choi matrix) may then be an indication of how nearly the process behaves as intended. Discrepancies between the experimental Choi matrix and the ideal Choi matrix may be used, by the designer, to adjust the process. For example, if the experimental Choi matrix shows unintended interactions between pairs of qubits (i.e., interactions not present in the ideal Choi matrix), the designer may make changes to reduce the unintended interaction, (e.g., if superconducting qubits are used, changing the frequencies of one or more qubits, so that the difference between the frequencies of two qubits with excessive interaction is increased).

Figure 2:
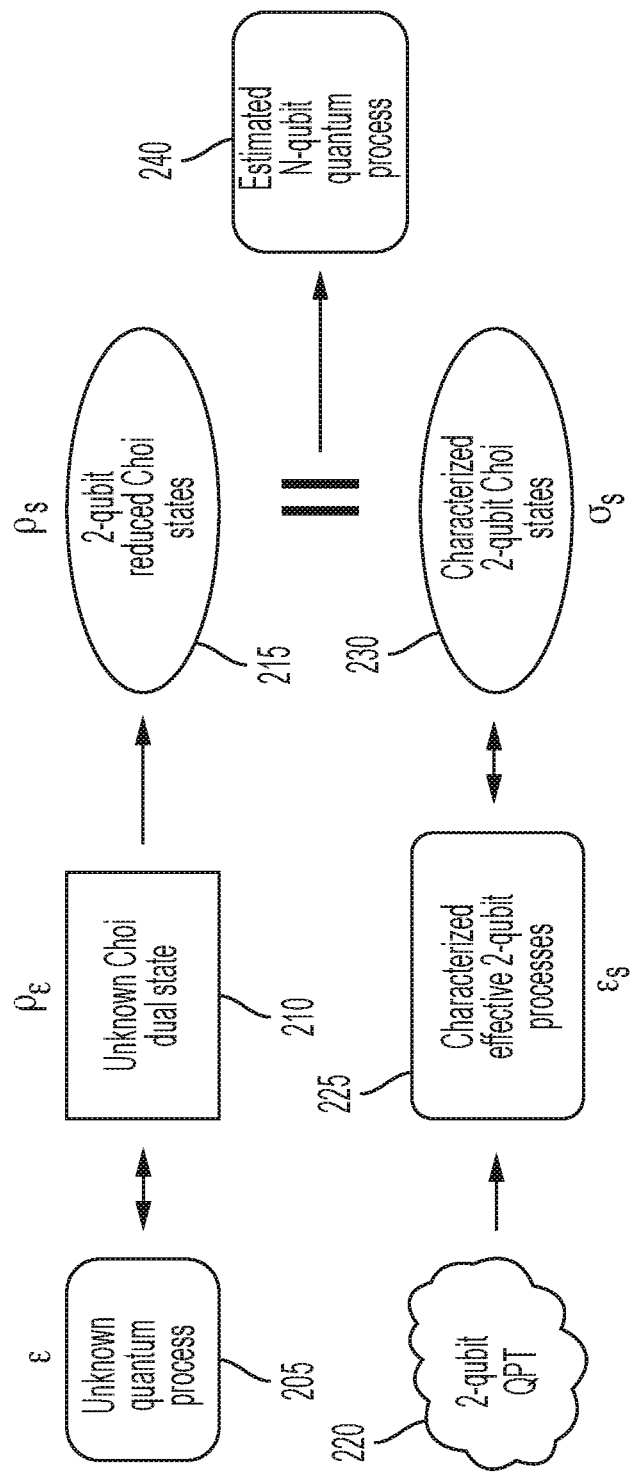
FIG. 2 is an information mapping diagram, according to an embodiment of the present invention.

In some embodiments, experimental or simulation data may be analyzed according to the MATLAB™ code included in the code listings below, to generate a set of $\chi_{d_{k,n}}^{j_{k,n}}$ that, when used as weights in Equations (3) and (2), results in a model of the quantum process, based on the pairwise perturbative ansatz. This process is illustrated in FIG. 2. An unknown quantum process 205 corresponds to an unknown Choi dual state 210, which, in turn, corresponds to a set of two-qubit reduced Choi states 215 ($\rho_S$), which are functions of the $\chi_{d_{k,n}}^{j_{k,n}}$. A set of measurements 220 results in a plurality of two-qubit process maps, corresponding to a set of characterized effective two-qubit processes 225, which may be mapped to a set of characterized effective two-qubit Choi states 230. Setting the set of two-qubit reduced Choi states 215 equal to the set of characterized effective two-qubit Choi states 230 and solving (in a least-squares sense) for the parameters (the $\chi_{d_{k,n}}^{j_{k,n}}$) of the two-qubit reduced Choi states 215, then results in an estimated N-qubit quantum process 240, i.e., a characterization of the N-qubit quantum process.

The listing entitled PAPA_for_PAPA_func.m is a top level function, in some embodiments. The argument passed in to this function is Glabs, a vector of labels for the simultaneous 3 qubit gate being studied. On lines 15 and 17, the variable Gs{1} is assigned, based on data read on line 17, from a data file containing, e.g., experimental data or simulation data. Gs{2} and Gs{3} are similarly initialized at lines 22 and 27, from respective data files read in at lines 20 and 25. Each of the variables Gs{1}, Gs{2}, and Gs{3} contains a 16×16 array which is, for example, a two-qubit process $\varepsilon_{k,n+k}$. At line 32, the function ProcessEstimation_Exp_Func( ) is called.

The function ProcessEstimation_Exp_Func( ) is defined in the listing entitled ProcessEstimation_Exp_Func.m It finds weights chiNM (corresponding to the weights $\chi$ of Equation (3)) such that Equation (2) approximates the N-qubit process. In this function, lines 14-41 define standard bases that are computed once to reduce computational burden in later steps. Lines 46-75 reformat the experimental data into a single vector. Lines 78-143 set up an initial condition for a solver that, as discussed in further detail below, is used to find values for the chiNM. Lines 146-166 define settings, upper bounds, and lower bounds for the solver. Line 171 identifies the objective function to be used by the solver, and line 175 calls the solver (a nonlinear least squares solver). When ProcessEstimation_Exp_Func( ) is run, the solver finds values of the chiNM that minimize the objective function. This set of chiNM may be used in Equation (3) to find the $\varepsilon_{k,n+k}$, which, when combined in the composition of Equation (2), form the characterization of the full N-qubit process, based on a pairwise perturbative ansatz.

The objective function used in the embodiment of the code listings included herein is defined in the listing entitled ProcessSolver_New_EC.m. In lines 42-55 of this listing, an effective process on each pair of qubits, given the full process described in pairwise perturbative ansatz form, is calculated. The function FullProcess( ) (which is defined in the listing entitled FullProcess.m) calculates the output state (given the chiNM and the input state), and takes a partial trace (using the function PartialTrace( ) (defined in the listing PartialTrace.m) to trace out spectator qubits that are not of interest).

Lines 61-143 (of the listing entitled ProcessSolver_New_EC.m) define the objective function. Within this set of lines, lines 61-82 are the constraints of the pairwise perturbative ansatz, lines 76-82 calculate the difference between $\sigma_S$ and $\rho_S$, and lines 84-140 enforce the constraint that the process be completely positive and trace preserving (by increasing the value of the objective function for any violations of these constraints). On line 143, the total cost vector (which is the return value of the objective function) is formed by concatenation of its components.

The function LocalReduction( ) (defined in the listing LocalReduction.m) is called by ProcessEstimation_Exp_Func( ) during the process of reformatting the experimental data into a single vector. The function PostProcessing_func (defined in the listing entitled PostProcessing_func.m, and called by PAPA_for_PAPA_func( ) performs checks of the results and produces warnings when any of the chi matrices chi12, chi13 and chi23 is not normal, it normalizes these matrices, and it performs one final enforcement that the result is completely positive and trace preserving.

In some embodiments, a processing circuit controls the N-qubit device, controlling its initial state, applying the circuit, and measuring the final state. The same processing circuit (or another processing circuit) may perform the analysis, i.e., the fitting of the composition of two-qubit processes to the measured behavior to obtain the $\chi_{i_{k,n}}^{j_{k,n}}$. The term "processing circuit" is used herein to mean any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general purpose hardware, such as a CPU, configured to execute instructions stored in a non-transitory storage medium. A processing circuit may be fabricated on a single printed circuit board (PCB) or distributed over several interconnected PCBs. A processing circuit may contain other processing circuits; for example a processing circuit may include two processing circuits, an FPGA and a CPU, interconnected on a PCB.

Code Listings

FullProcess.m
```
 1 function rhoO=FullProcess(chi,B2,B213,rhoI)
 2 % This function calculates output state given the input
   state, chi matrix,
 3 % and basis operators
 4 % Input:
 5 % chi: cell array of chi matrices describing the process
   [chi23,chi13,chi12]
 6 % B2: cell array basis operators for 2 qubits
 7 % B213: cell array of basis of operators for 2 qubit
   processes with identity in the middle
 8 % rhoI: input state
 9 % Output:
10 % rhoO: output state
11
12 I=eye(2);
13
14 % 2-3 process
15 rho23=zeros(size(rhoI,1));
16 for qq=1:1:length(B2)
17 for pp=1:1:length(B2)
18         rho23=rho23+chi{1}(qq,pp).*kron(I,B2{qq})
   *rhoI*kron(I,B2{pp})';
19 end
20 end
21
22 % 1-3 process
23 rho13=zeros(size(rhoI,1));
24 for qq=1:1:length(B213)
25 for pp=1:1:length(B213)
26                       rho13=rho13+chi{2}(qq,pp)
   .*B213{qq}*rho23*B213{pp}';
27 end
28 end
29
30 % 1-2 process
31 rhoO=zeros(size(rhoI,1));
32 for qq=1:1:length(B2)
33 for pp=1:1:length(B2)
34         rhoO=rhoO+chi{3}(qq,pp).*kron(B2{qq},I)
   *rho13*kron(B2{pp},I)';
35 end
36 end
37 end
```

LocalReduction.m
```
 1 function sigma=LocalReduction(E)
 2 % This function calculates the Choi dual-state of the
   local process
 3
 4 I2=eye(2.^2);
 5 unit2=@(x) I2(:,x);
 6
 7 sigma=zeros(2.^4);
 8
 9 for nn=1:1:4
10 for mm=1:1:4
11 P=unit2(nn)*unit2(mm)';
12 Pt=P';
13 Pv=Pt(:);
14 EPv=E*Pv;
15 EPt=zeros(2.^2);
16 EPt(:)=EPv;
17 EP=EPt';
18
19 sigma=sigma+kron(P,EP)./4;
20 end
21 end
22
23 end
```

PAPA_for_PAPA_func.m
```
 1 % Plug And Play Application for Pairwise Perturbative
   Ansatz (PAPA for
 2 % PAPA)
 3
 4 function [ ]=PAPA_for_PAPA_func(Glabs)
 5
 6 % Input:
 7 % Glabs: vector of labels for the simultaneous 3 qubit
   gate being studied.
 8 % I-→1, X90-→2, Y90-→3, order is [g1,g2,g3] applied
   to qubit [q1,q2,q3]
 9
10 % Load the process matrices from the .mat files
   containing the GST data
```

```
11 % (generated by the python notebook)
12
13 IdGs={'I', 'X', 'Y'};
14
15 gates=load('Q12.mat');
16 glab=strcat(IdGs{Glabs(1)}, IdGs{Glabs(2)});
17 Gs{1}=gates.(glab);
18 clear glab gates II IX IY XI YI XX YY XY YX
19
20 gates=load('Q13.mat');
21 glab=strcat(IdGs{Glabs(1)},IdGs{Glabs(3)});
22 Gs{2}=gates.(glab);
23 clear glab gates II IX IY XI YI XX YY XY YX
24
25 gates=load('Q23.mat');
26 glab=strcat(IdGs{Glabs(2)},IdGs{Glabs(3)});
27 Gs{3}=gates.(glab);
28 clear glab gates II IX IY XI YI XX YY XY YX
29
30 % Run the PAPA reconstruction
31     filename=strcat('PAPA_gate_',IdGs{Glabs(1)},
   IdGs{Glabs(2)},IdGs{G labs(3)});
32 ProcessEstimation_Exp_Func(Gs,Glabs,filename);
33
34 % Post process the reconstructions to ensure they are
   CPTP maps
35 name2=strcat('Processed',filename);
36 PostProcessing_func(filename,name2);
37
38 % Run the data analysis to compare the reconstructed
   process to the
39 % measurement data
40 savefile=strcat('Analysis',filename);
41 DataAnalysis(Gs,Glabs,name2,savefile);
42
43 end
PartialTrace.m
 1 function [rhoPT]=PartialTrace(rho,qs,dim,num)
 2 % This function calculates the partial trace of a density
   matrix
 3 % Input:
 4 % rho: full density matrix
 5 % qs: a vector of length num, with a 1 if the qudit is to
   be traced
 6 % out and a 0 otherwise
 7 % dim: vector of the dimensions of the each qudit (same
   order as qs)
 8 % num: total number of subsystems
 9 % Output:
10 % rhoPT: the partial trace density matrix
11 %
12 % Iv=eye(dim);
13 %
14 % unitV=@(x) Iv(:,x);
15 %
16 % rhoPT=rho;
17 %
18 % for kk=1:1:num
19 % if qs(kk)==1%
20     tempRho=zeros(dim.^(num-sum(qs(1:kk))),dim.^
   (num-sum(qs(1:kk))));
21 % for jj=1:1:dim
22 % tempOp=kron(eye(dim^(kk-1-sum(qs(1:(kk-1))))),
   kron(unitV(jj),eye(dim^(num-kk))));
23 % tempRho=tempRho+tempOp'*rhoPT*tempOp;
24 % end
25 % rhoPT=tempRho;
26 % end
27 % end
28 % end
29
30
31 rhoPT=rho;
32
33 for kk=1:1:num
34 if qs(kk)==1
35 Iv=eye(dim(kk));
36 unity=@(x) Iv(:,x);
37
38 tdim=prod(dim)/prod(dim(qs(1:kk)==1));
39 tempRho=zeros(tdim);
40 for jj=1:1:dim(kk)
41 tdim2=prod(dim(qs(1:(kk-1))==0));
42 tdim3=prod(dim((kk+1):end));
43     tempOp=kron(eye(tdim2),kron(unitV(jj),eye
   (tdim3)));
44 tempRho=tempRho+tempOp'*rhoPT*tempOp;
45 end
46 rhoPT=tempRho;
47 end
48 end
49 end
PostProcessing_func.m
 1 function PostProcessing_func(name,name2)
 2
 3 load(name)
 4
 5 % chi12
 6 [V,D,W]=eig(chi12);
 7
 8 if max(max(abs(V-W)))>1e-7
 9 'Chi12 is not normal'
10 return
11 end
12
13
14 D(D<0)=0;
15 chi12p=V*D*V';
16
17 chi12=4.*chi12p./trace(chi12p);
18
19 % chi13
20 [V,D,W]=eig(chi13);
21
22 if max(max(abs(V-W)))>1e-7
23 'Chi13 is not normal'
24 return
25 end
26
27 D(D<0)=0;
28 chi13p=V*D*V';
29
30 chi13=4.*chi13p./trace(chi13p);
31
32 % chi23
33 [V,D,W]=eig(chi23);
34
35 if max(max(abs(V-W)))>1e-7
36 'chi23 is not normal'
37 return
38 end
39
40 D(D<0)=0;
41 chi23p=V*D*V';
```

```
42
43 chi23=4.*chi23p./trace(chi23p);
44
45
46 save(name2, 'chi12', 'chi13', 'chi23');
47
48 end
ProcessEstimation_Exp_Func.m
 1  function H=ProcessEstimation_Exp_Func(Gs,Glabs,
    filename)
 2 % Input:
 3 % Gs: process matrices in the standard basis obtained
    from GST
 4 % Glabs: labels for the ideal gates of the process I-→1,
    X90-→2, Y90-→3%
 5 filename: name of the file to which the output is saved
 6 %
 7 % Output:
 8 % chiNM: chi matrix for qubits NM in the PAPA ansatz
 9 % fval: final value of the PAPA optimization objective
    function (smaller is better)
10 % time: how long the full optimization took
11 % solopts: options used in the optimization solver
12
13
14 % Useful operators and functions
15 I=eye(2);
16 I2=eye(2.^2);
17 unit1=@(x) I(:,x);
18 unit2=@(x) I2(:,x);
19
20 % Two and three qubit standard basis operators.
21 % These are precomputed once and then passed to the
    objective function to reduce computation time.
22
23 B2=cell(16,1);
24 B213=cell(16,1);
25 for ii=1:1:4
26 for jj=1:1:4
27 B2{4.*(ii-1)+jj}=unit2(ii)*unit2(jj)';
28 end
29 end
30
31 iB213=cell(4,4);
32 for aa=1:1:2
33 for bb=1:1:2
34 for cc=1:1:2
35 for dd=1:1:2
36  iB213{2.*(aa-1)+bb,2.*(cc-1)+dd}=kron(kron(unit1
    (aa),I),unit1(bb))*kron(kron(unit1(cc),I), unit1(dd))';
37   B213{4.*((2.*(aa-1)+bb)-1)+2.*(cc-1)+dd}=kron
    (kron(unit1(aa),I),unit1(bb))*kron(kron(unit1(cc),I),
    unit1(dd))';
38 end
39 end
40 end
41 end
42
43 % Data constraints, these define the RHS of the
   equation to be solved. Also
44 % passed to the objective function.
45
46 dim=16;
47 Nel=nchoosek(dim+1,2);
48
49 % Local reductions
50
51 sigma12=LocalReduction(Gs{1});
52 sigma13=LocalReduction(Gs{2});
53 sigma23=LocalReduction(Gs{3});
54
55 % Enforce CPTP
56 sigma12=PostProcess(sigma12);
57 sigma13=PostProcess(sigma13);
58 sigma23=PostProcess(sigma23);
59
60 temp12=zeros(Nel,1);
61 temp12(:)=4.*sigma12(triu(true(dim)));
62 temp12r=real(temp12);
63 temp12i=imag(temp12);
64
65 temp13=zeros(Nel,1);
66 temp13(:)=4.*sigma13(triu(true(dim)));
67 temp13r=real(temp13);
68 temp13i=imag(temp13);
69
70 temp23=zeros(Nel,1);
71 temp23(:)=4.*sigma23(triu(true(dim)));
72 temp23r=real(temp23);
73 temp23i=imag(temp23);
74
75      sigmaVec=[temp12r;temp13r;temp23r;temp12i;
    temp13i;temp23i]./4;
76
77 % Initial condition (ideal gate)
78 x0=zeros(6*Nel,1);
79
80 % Define the X90 and Y90 gates
81 phi=pi/4;
82 % X90=[cos(phi),-1i*sin(phi);-1i*sin(phi),cos(phi)];
83 % Y90=[cos(phi),-sin(phi);sin(phi),cos(phi)];
84
85 % Sandia convention
86   X90=[cos(-phi),-1i*sin(-phi);-1i*sin(-phi),cos(-
    phi)];
87 Y90=[cos(phi),-sin(phi);sin(phi),cos(phi)];
88
89 IdGs={I,X90,Y90};
90
91 g1=IdGs{Glabs(1)};
92 g2=IdGs{Glabs(2)};
93 g3=IdGs{Glabs(3)};
94
95 G1=kron(g1,I);
96 G2=kron(g2,I);
97 G3=kron(I,g3);
98
99 sigma12_id=zeros(2.^4);
100 sigma13_id=zeros(2.^4);
101 sigma23_id=zeros(2.^4);
102
103 for nn=1:1:4
104 for mm=1:1:4
105 % Initial condition
106 sigma12_id=sigma12_id+kron(unit2(nn)*unit2(mm)
    ',G1*(unit2(nn)*unit2(mm)')*G1')./4;
107 sigma23_id=sigma23_id+kron(unit2(nn)*unit2(mm)
    ',G2*(unit2(nn)*unit2(mm)')*G2')./4;
108 sigma13_id=sigma13_id+kron(unit2(nn)*unit2(mm)
    ',G3*(unit2(nn)*unit2(mm)')*G3')./4:
109 end
110 end
111
112 chi12I=zeros(2.^4);
```

```
113 chi13I=zeros(2.^4);
114 chi23I=zeros(2.^4);
115
116 for i1=1:1:4
117  for i2=1:1:4
118   for i3=1:1:4
119    for i4=1:1:4
120     chi12I(4*(i1-1)+i2,4*(i3-1)+i4)=4.*sigma12_id(4*(i2-1)+i1,4*(i4-1)+i3);
121     chi13I(4*(i1-1)+i2,4*(i3-1)+i4)=4.*sigma13_id(4*(i2-1)+i1,4*(i4-1)+i3);
122     chi23I(4*(i1-1)+i2,4*(i3-1)+i4)=4.*sigma23_id(4*(i2-1)+i1,4*(i4-1)+i3);
123    end
124   end
125  end
126 end
127
128 temp12I=zeros(Nel,1);
129 temp12I(:)=chi12I(triu(true(dim)));
130 temp12Ir=real(temp12I);
131 temp12Ii=imag(temp12I);
132
133 temp13I=zeros(Nel,1);
134 temp13I(:)=chi13I(triu(true(dim)));
135 temp13Ir=real(temp13I);
136 temp13Ii=imag(temp13I);
137
138 temp23I=zeros(Nel,1);
139 temp23I(:)=chi23I(triu(true(dim)));
140 temp23Ir=real(temp23I);
141 temp23Ii=imag(temp23I);
142
143     x0(:)=[temp12Ir;temp13Ir;temp23Ir;temp12Ii;temp13Ii;temp23Ii];
144
145 % Options for solver
146 tolfun=1e-7;
147 tolx=1e-7;
148 maxfun=1e6;
149 maxiter=1e6;
150 solopts={tolfun,tolx,maxfun,maxiter};
151 options=optimset('TolFun',tolfun, 'TolX',tolx, 'MaxFunEvals',maxfun, 'MaxIter',maxiter, 'Algorithm', 'trust-region-reflective');
152
153 % Bounds for solver
154
155 % Upper bound (all elements are upper bounded by 2, diagonal by 4)
156 % ub=2.*ones(size(x0));
157 ubmat=2.*ones(size(sigma12));
158 ubmat=ubmat+diag(diag(ubmat));
159 ubvec=ubmat(triu(true(dim)));
160 ub=[ubvec;ubvec;ubvec;ubvec;ubvec;ubvec];
161
162 % Lower bound (some elements are lower bounded by -4, others by 0)
163 lbmat=-4.*ones(size(sigma12));
164 lbmat=lbmat-diag(diag(lbmat));
165 lbvec=lbmat(triu(true(dim)));
166 lb=[lbvec;lbvec;lbvec;lbvec;lbvec;lbvec];
167
168 % Equation solution
169
170 % The objective function.
171     fs=@(chilist)ProcessSolver_New_EC(chilist,sigmaVec,B2,B213,i B213);
172
173 % Solution via minimizing least squares
174 tic
175 [chilistmin,fval]=lsqnonlin(fs,x0,lb,ub,options);
176 time=toc;
177
178 chi12=zeros(dim);
179 chi13=zeros(dim);
180 chi23=zeros(dim);
181
182     chi12(triu(true(dim)))=chilistmin(1:Nel)+1i.*chilistmin((3*(Nel)+1):4*(Nel));
183
184 chi13(triu(true(dim)))=chilistmin((Nel+1):2*(Nel))+1i.*chilistmin((4*(Nel)+1):5*(Nel));
185
186     chi23(triu(true(dim)))=chilistmin((2*(Nel)+1):3*(Nel))++1i.*chilistmin((5*(Nel)+1):6*(Nel));
187
188 chi12=chi12+chi12';
189 chi12=chi12-diag(diag(chi12))./2;
190
191 chi13=chi13+chi13';
192 chi13=chi13-diag(diag(chi13))./2;
193
194 chi23=chi23+chi23';
195 chi23=chi23-diag(diag(chi23))./2;
196
197 save(filename, 'chi12', 'chi13', 'chi23', 'fval', 'time', 'solo pts')
198
199 end
ProcessSolver_New_EC.m
1 function F=ProcessSolver_New_EC(chilist,sigmaVec,B2,B213,iB213)
2 % This function returns the value of the objective function (equations to be solved) evaluated at
3 % the chi matrix elements chilist
4 % Input:
5 % chilist: vectorized list of chi matrix elements for the unknown process
6
7 % sigmaVec: Constraints from simulated data. Order: [temp12r;temp13r;temp23r;temp12i;temp13i;temp23i];
8
9 % B2: Two-qubit operator basis (to speed up calculations)
10
11 % B213: Two-qubit operator basis with identity between
12
13 % iB213: Two-qubit input state basis from the maximally entangled state
14
15 % Output:
16 % F: vector of the function values. length(F)=816
17
18 I2=eye(2.^2);
19 unit2=@(x) I2(:,x);
20
21 dim=16;
22 Nel=nchoosek(dim+1,2);
23
24 chi12=zeros(dim);
```

```
25 chi13=zeros(dim);
26 chi23=zeros(dim);
27
28 chi12(triu(true(dim)))=chilist(1:Nel)+1i.*chilist((3*(Nel)+1):4*(Nel));
29 chi13(triu(true(dim)))=chilist((Nel+1):2*(Nel))+1i.*chilist((4*(Nel)+1):5*(Nel));
30 chi23(triu(true(dim)))=chilist((2*(Nel)+1):3*(Nel))++1i.*chilist((5*(Nel)+1):6*(Nel));
31
32 chi12=chi12+chi12';
33 chi12=chi12-diag(diag(chi12))./2;
34 chi13=chi13+chi13';
35 chi13=chi13-diag(diag(chi13))./2;
36 chi23=chi23+chi23';
37 chi23=chi23-diag(diag(chi23))./2;
38
39
40 chis={chi23,chi13,chi12};
41
42 rho12=zeros(2.^4);
43 rho13=zeros(2.^4);
44 rho23=zeros(2.^4);
45 for nn=1:1:4
46 for mm=1:1:4
47 rho12=rho12+kron(unit2(nn)*unit2(mm)',PartialTrace(FullProcess(chis,B_2,B213,kron(unit2(nn)*unit2(mm)',eye(2))),[0,0,1],[2,2,2], 3));
48 rho13=rho13+kron(unit2(nn)*unit2(mm)',PartialTrace(FullProcess(chis,B_2,B213,iB213{nn,mm}),[0,1,0],[2,2,2],3));
49 rho23=rho23+kron(unit2(nn)*unit2(mm)',PartialTrace(FullProcess(chis,B_2,B213,kron(eye(2),unit2(nn)*unit2(mm)')),[1,0,0],[2,2,2],3));
50 end
51 end
52
53 rho12=rho12./8;
54 rho13=rho13./8;
55 rho23=rho23./8;
56%
57 Function solver
58%
59 Constraints from data
60
61 temp12=zeros(Nel,1);
62 temp12(:)=rho12(triu(true(dim)));
63 temp12r=real(temp12);
64 temp12i=imag(temp12);
65
66 temp13=zeros(Nel,1);
67 temp13(:)=rho13(triu(true(dim)));
68 temp13r=real(temp13);
69 temp13i=imag(temp13);
70
71 temp23=zeros(Nel,1);
72 temp23 (:)=rho23(triu(true(dim)));
73 temp23r=real(temp23);
74 temp23i=imag(temp23);
75
76 F(1:Nel)=temp12r(:)-sigmaVec(1:Nel);
77 F((Nel+1):2*(Nel))=temp13r(:)-sigmaVec((Nel+1):2*(Nel));
78 F((2*(Nel)+1):3*(Nel))=temp23r(:)-sigmaVec((2*(Nel)+1):3*(Nel));
79
80 F((3*(Nel)+1):4*(Nel))=temp12i(:)-sigmaVec((3*(Nel)+1):4*(Nel));
81 F((4*(Nel)+1):5*(Nel))=temp13i(:)-sigmaVec((4*(Nel)+1):5*(Nel));
82 F((5*(Nel)+1):6*(Nel))=temp23i(:)-sigmaVec((5*(Nel)+1):6*(Nel));
83
84 % Trace constraints
85 F(6*(Nel)+1)=trace(chi12)-4;
86 F(6*(Nel)+2)=trace(chi13)-4;
87 F(6*(Nel)+3)=trace(chi23)-4;
88
89 % Eigenvalue constraints
90 e1=eig(chi12);
91 e2=eig(chi13);
92 e3=eig(chi23);
93
94 F(6*(Nel)+4)=abs(sum(e1(e1<0)));
95 F(6*(Nel)+5)=abs(sum(e2(e2<0)));
96 F(6*(Nel)+6)=abs(sum(e3(e3<0)));
97%
98 Physicality constraints
99
100 Ib=eye(2.^2);
101 Zb=zeros(2.^2);
102
103 F12m=zeros(2.^2);
104 for ii=1:1:4
105 for jj=1:1:4
106 for kk=1:1:4
107 for ll=1:1:4
108 F12m=F12m+chi12(4*(ii−1)+jj,4*(kk−1)+ll).*(unit2(kk)*unit2(ll)')'*(unit2(ii)*unit2(jj)');
109 end
110 end
111 end
112 end
113 F12r=real(F12m(:))-Ib(:);
114 F12i=imag(F12m(:))-Zb(:);
115
116 F13m=zeros(2.^2);
117 for ii=1:1:4
118 for jj=1:1:4
119 for kk=1:1:4
120 for ll=1:1:4
121 F13m=F13m+chi13(4*(ii−1)+jj,4*(kk−1)+ll).*(unit2(kk)*unit2(ll)')'*(unit2(ii)*unit2(jj)');
122 end
123 end
124 end
125 end
126 F13r=real(F13m(:))-Ib(:);
127 F13i=imag(F13m(:))-Zb(:);
128
129 F23m=zeros(2.^2);
130 for ii=1:1:4
131 for jj=1:1:4
132 for kk=1:1:4
133 for ll=1:1:4
134 F23m=F23m+chi23(4*(ii−1)+jj,4*(kk−1)+ll).*(unit2(kk)*unit2(ll)')'*(unit2(ii)*unit2(jj)');
135 end
136 end
137 end
138 end
139 F23r=real(F23m(:))-Ib(:);
140 F23i=imag(F23m(:))-Zb(:);
```

141
142
143 F=[F,F12r.',F13r.',F23r.',F12i.',F13i.',F23i.'].';

As used herein, the word "or" is inclusive, so that, for example, "A or B" means any one of (i) A, (ii) B, and (iii) A and B. Although limited embodiments of a method for characterizing a quantum process have been specifically described and illustrated herein, many modifications and variations will be apparent to those skilled in the art. Accordingly, it is to be understood that a method for characterizing a quantum process employed according to principles of this invention may be embodied other than as specifically described herein. The invention is also defined in the following claims, and equivalents thereof.

What is claimed is:

1. A method for characterizing an N-qubit process, N being an integer greater than 2, the method comprising:
    performing a plurality of characterization measurements of the N-qubit process to form a plurality of process maps, and
    fitting the plurality of process maps with a composition of K-qubit processes, K being an integer greater than 1 and less than N.

2. The method of claim 1, wherein the performing of the plurality of characterization measurements comprises performing the characterization measurements with a method that excludes state-preparation and measurement errors.

3. The method of claim 2, wherein the performing of the plurality of characterization measurements comprises performing the characterization measurements with gate set tomography.

4. The method of claim 1, wherein the performing of a characterization measurement of the plurality of characterization measurements comprises:
    preparing K qubits of interest in a first state;
    preparing N-K spectator qubits in a maximally mixed state;
    applying a circuit comprising one or more gates to the K qubits of interest and to the N-K spectator qubits; and
    measuring, after the applying of the circuit, the state of the K qubits of interest.

5. The method of claim 1, wherein the performing of a characterization measurement of the plurality of characterization measurements comprises:
    preparing K qubits of interest in a first state;
    preparing N-K spectator qubits in a state randomly selected from a uniform distribution of the set of spectator qubit logical states;
    applying a circuit comprising one or more gates to the K qubits of interest and to the N-K spectator qubits; and
    measuring, after the applying of the circuit, the state of the K qubits of interest.

6. The method of claim 1, wherein K=2.

7. The method of claim 6, wherein the performing of the plurality of characterization measurements comprises performing the characterization measurements with a method that excludes state-preparation and measurement errors.

8. The method of claim 7, wherein the performing of the plurality of characterization measurements comprises performing the characterization measurements with gate set tomography.

9. The method of claim 6, wherein the performing of a characterization measurement of the plurality of characterization measurements comprises:
    preparing K qubits of interest in a first state;
    preparing N-K spectator qubits in a maximally mixed state;
    applying a circuit comprising one or more gates to the K qubits of interest and to the N-K spectator qubits; and
    measuring, after the applying of the circuit, the state of the K qubits of interest.

10. The method of claim 6, wherein the performing of a characterization measurement of the plurality of characterization measurements comprises:
    preparing K qubits of interest in a first state;
    preparing N-K spectator qubits in a state randomly selected from a uniform distribution of the set of spectator qubit logical states;
    applying a circuit comprising one or more gates to the K qubits of interest and to the N-K spectator qubits; and
    measuring, after the applying of the circuit, the state of the K qubits of interest.

11. A system, comprising:
    an N-qubit device; and
    a processing circuit, connected to the N-qubit device,
    the processing circuit being configured to:
    perform a plurality of characterization measurements of an N-qubit process to form a plurality of process maps, and
    fit the plurality of process maps with a composition of K-qubit processes, K being an integer greater than 1 and less than N.

12. The system of claim 11, wherein the performing of the plurality of characterization measurements comprises performing the characterization measurements with a method that excludes state-preparation and measurement errors.

13. The system of claim 12, wherein the performing of the plurality of characterization measurements comprises performing the characterization measurements with gate set tomography.

14. The system of claim 11, wherein the performing of a characterization measurement of the plurality of characterization measurements comprises:
    preparing K qubits of interest in a first state;
    preparing N-K spectator qubits in a maximally mixed state;
    applying a circuit comprising one or more gates to the K qubits of interest and to the N-K spectator qubits; and
    measuring, after the applying of the circuit, the state of the K qubits of interest.

15. The system of claim 11, wherein the performing of a characterization measurement of the plurality of characterization measurements comprises:
    preparing K qubits of interest in a first state;
    preparing N-K spectator qubits in a state randomly selected from a uniform distribution of the set of spectator qubit logical states;
    applying a circuit comprising one or more gates to the K qubits of interest and to the N-K spectator qubits; and
    measuring, after the applying of the circuit, the state of the K qubits of interest.

16. The system of claim 11, wherein K=2.

17. The system of claim 16, wherein the performing of the plurality of characterization measurements comprises performing the characterization measurements with a method that excludes state-preparation and measurement errors.

18. The system of claim 17, wherein the performing of the plurality of characterization measurements comprises performing the characterization measurements with gate set tomography.

19. The system of claim 16, wherein the performing of a characterization measurement of the plurality of characterization measurements comprises:

preparing K qubits of interest in a first state;
preparing N-K spectator qubits in a maximally mixed state;
applying a circuit comprising one or more gates to the K qubits of interest and to the N-K spectator qubits; and
measuring, after the applying of the circuit, the state of the K qubits of interest.

20. The system of claim 16, wherein the performing of a characterization measurement of the plurality of characterization measurements comprises:
preparing K qubits of interest in a first state;
preparing N-K spectator qubits in a state randomly selected from a uniform distribution of the set of spectator qubit logical states;
applying a circuit comprising one or more gates to the K qubits of interest and to the N-K spectator qubits; and
measuring, after the applying of the circuit, the state of the K qubits of interest.

\* \* \* \* \*